United States Patent
Baum et al.

(10) Patent No.: US 7,271,663 B2
(45) Date of Patent: Sep. 18, 2007

(54) OPERATIONAL AMPLIFIER OUTPUT STAGE AND METHOD

(75) Inventors: David R. Baum, Tucson, AZ (US); Vadim V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 11/210,036

(22) Filed: Aug. 23, 2005

(65) Prior Publication Data

US 2007/0046378 A1    Mar. 1, 2007

(51) Int. Cl.
*H03F 1/22* (2006.01)
(52) U.S. Cl. .................................... 330/311
(58) Field of Classification Search ............ 330/311, 330/98–100, 310, 133, 150, 192, 267, 264
See application file for complete search history.

(56) References Cited

U.S. PATENT DOCUMENTS

| | | | |
|---|---|---|---|
| 6,150,883 A | 11/2000 | Ivanov | 330/253 |
| 6,642,789 B2 * | 11/2003 | Ivanov et al. | 330/253 |
| 6,657,495 B2 | 12/2003 | Ivanov et al. | 330/255 |
| 6,788,143 B1 * | 9/2004 | Chen | 330/253 |

* cited by examiner

*Primary Examiner*—Robert Pascal
*Assistant Examiner*—Krista M Flanagan
(74) *Attorney, Agent, or Firm*—Wade J. Brady, III; Frederick J. Telecky, Jr.

(57) ABSTRACT

An operational amplifier includes an input stage for producing a voltage signal in response to an input signal. An output stage includes an output transistor having a source coupled to a supply voltage and a gate coupled to receive the voltage signal. An output cascode transistor has a source coupled to a drain of the output transistor and a drain coupled to an output conductor. A gate control amplifier includes an input stage including a first input transistor having a control electrode coupled to the source of the output cascode transistor and an active load transistor, the input transistor and the active load transistor being coupled to a gate of the output cascode transistor. The gate control amplifier also includes a feedback amplifier having an input coupled to the source of the output cascode transistor and an output coupled to a control electrode of the active load transistor.

20 Claims, 3 Drawing Sheets

OPERATIONAL AMPLIFIER OUTPUT STAGE AND METHOD

BACKGROUND OF THE INVENTION

The present invention relates generally to integrated circuit amplifier circuits, and more particularly to operational amplifiers capable of delivering high output currents, and more particularly to avoiding high power dissipation in the output stage of a high-output-current operational amplifier. The invention also relates to avoiding use of additional voltage source circuits and associated large capacitances for providing constant voltages to the gates of high-voltage output cascode transistors of the output stage of the operational amplifier.

FIG. 1 illustrates a prior art integrated circuit operational amplifier 1A in which some of the transistors, including the output stage cascode transistors 29 and 30, are high-voltage transistors used to provide high voltage operation, other transistors of the operational amplifier being low-voltage transistors which are used to provide high speed and high bandwidth operation. The structure of the circuit of FIG. 1 is disclosed in commonly owned U.S. Pat. No. 6,657,495 issued Dec. 2, 2003 to Ivanov et al., and its operation is partly described in that patent and also is further described in another commonly owned U.S. Pat. No. 6,150,883 issued Nov. 21, 2000 to Ivanov that is incorporated by reference into U.S. Pat. No. 6,657,495.

Input stage 21, folded cascode stage 45, and class AB bias circuit 46 of FIG. 1 are the same as in subsequently described FIG. 3. The drain of cascode transistor 13 in FIG. 1 is connected by conductor 25 to the gate of a P-channel output transistor 27 and output stage 49A. The drain of cascode transistor 15 in folded cascode stage 45 is connected by conductor 26 to the gate of a N-channel output transistor 28.

Output stage 49C includes above-mentioned P-channel output transistor 27 and N-channel output transistor 28. The source of output transistor 27 is connected to VDD, and the source of output transistor 28 is connected to ground. The drain of output transistor 50 is connected by conductor 50 to the source of a P-channel output cascode transistor 29, the drain of which is connected by Vout conductor 31 to produce the output voltage Vout. Similarly, the drain of output transistor 20 is connected by conductor 60 to the source of N-channel output cascode transistor 30, the drain of which is connected to conductor 31. A constant voltage source 32 is connected between VDD and the gate of output cascode transistor 29 to provide a constant gate voltage thereon, and a voltage source 33 is connected between ground and the gate of output cascode transistor 30 to provide a relatively constant gate-to-source voltage on it. Relatively large capacitors C1 and C2 are connected across voltage sources 32 and 33 as shown to effectively maintain the needed constant gate-to-source voltages of output cascode transistors 29 and 30.

During large-signal excursions of Vout, the parasitic capacitance from the source to the gate of output cascode transistors 29 and 30 can result in large peak currents. If the voltage sources 32 and 33 are unable to maintain the gate voltages of output cascode transistors 29 and 30 at relatively constant values, the result can be undesirable signal distortion in Vout.

In operational amplifier 1A of FIG. 1, voltage sources 32 and 33 need to have low impedance at high frequencies, and in low-current circuits this is achieved by providing the capacitors C1 and C2 to produce a low value of high-frequency impedance at the gates of output cascode transistors 29 and 30 so that output cascode transistors 29 and 30 do not introduce appreciable delay in the signal path of such low-current operational amplifier circuits.

However, high-current implementations of the operational amplifier circuit 1A of voltage sources 32 and 33 also need to have low values of high-frequency impedance in order to provide high-bandwidth. The high frequency impedance referred to should be substantially lower, roughly 5 to 10 times smaller, than the gate impedances of output cascode transistors 29 and 30 to avoid signal distortion in Vout. It should be appreciated that high impedance at the drains of output transistors 27 and 28 can cause distortion in Vout. High impedance of the voltage sources 32 and 33 in prior art FIG. 1 during signal transients causes signal changes at the drains of output transistors 27 and 28. This causes signal distortion because of parasitic feedback through gate-drain capacitances of output transistors 27 and 28.

Unfortunately, in order to achieve the needed low values of high-frequency impedance in a high-current operational amplifier circuit having the construction of prior art FIG. 1, the capacitance of capacitors C1 and C2 needs to be so large that it is unfeasible to include them on the same integrated circuit chip. This is undesirable because the large amount of capacitance required for high-current applications makes it impractical to provide capacitors C1 and C2 on the same integrated circuit chip as the rest of the operational amplifier circuitry. This is highly undesirable to most customers, and therefore it has been impractical to use the structure of FIG. 1 in a state-of-the-art high-current integrated circuit operational amplifier.

FIG. 2 illustrates an amplifying circuit 1B including an output stage 49B which is capable only of sinking current from a load (not shown). Output transistor 28 and output cascode transistor 30 are the same as in prior art FIG. 1, but voltage source 33 and capacitor C2 of FIG. 1 have a been replaced by a gate control amplifier circuit 67. Gate control amplifier circuit 67 includes a N-channel transistor 61 having its source connected to ground and its drain connected by conductor 63 to the gate of output cascode transistor 30 and to one terminal of a current source 68, the other terminal of which is connected to VDD, wherein conductor 63 functions as the output of gate control amplifier 67.

The amplitude of the current source 68 is necessarily larger than the maximum instantaneous gate current of output cascode transistor 30. Since the magnitude of the current source 68 would be that large for a high-current output stage 49B, the result of using the current source 68 would be an unacceptably large increase in the overall power consumption of the amplifying circuit 1B if it is designed to sink large output currents.

No solution to the foregoing problems of high current implementations of the circuits of prior art prior art FIGS. 1 and 2 have been provided, so it has been impractical to use the output stage circuit structures of FIGS. 1 and 2 in high-current integrated circuit operational amplifiers or in output stages of other kinds of amplifier circuitry.

Thus, there is an unmet need for an amplifier including an output circuit which is capable of providing high output current without the need for using the large capacitors of prior art FIG. 1.

There also is an unmet need for an amplifier including an output circuit which is capable of providing high output current without the need for providing the voltage sources 32 and 33 required in the circuit of prior art FIG. 1.

There also is an unmet need for an amplifier including an output circuit which is capable of providing high output current without high power dissipation required using the circuit of prior art FIG. 2.

There also is an unmet need for an amplifier including an output circuit which is capable of providing high output current with reduced signal distortion.

SUMMARY OF THE INVENTION

It is an object of the invention to provide amplifier circuitry including an output circuit which is capable of providing high output current without the need for using the large capacitors required in the circuit of prior art FIG. 1.

It is another object of the invention to provide amplifier circuitry including an output circuit which is capable of providing high output current without the need for using the voltage source circuits 32 and 33 required in the circuit of prior art FIG. 1.

It is another object of the invention to provide amplifier circuitry including an output circuit which is capable of providing high output current without incurring the high power dissipation that would result if the configuration of the output stage circuit of prior art FIG. 2 were to be utilized.

It is another object of the invention to provide an amplifier including an output circuit which is capable of providing high output current with reduced signal distortion.

Briefly described, and in accordance with one embodiment, the present invention provides an operational amplifier (1C) that includes an input stage (21) for producing a voltage signal (25) in response to an input signal, an output stage (49C) with an output transistor (27) having a source coupled to a supply voltage and a gate coupled to receive the voltage signal (25). An output cascode transistor (29) has a source coupled to a drain of the output transistor (27) and a drain coupled to an output conductor (31). A gate control amplifier (57A) includes an input stage including a first input transistor (51) having a control electrode (50) coupled to the source of the output cascode transistor (29) and a active load transistor (54), the input transistor (51) and the active load transistor (54) being coupled to a gate of the output cascode transistor (29). The gate control amplifier (57A) also includes an ancillary amplifier having an input coupled to the source of the output cascode transistor (29) and an output coupled to a control electrode of the active load transistor (54).

In one embodiment, the invention provides an amplifier (1C) including an input stage (21) for producing a first voltage signal and an output stage (49C) for producing an output signal (Vout) in response to the first voltage signal, the output stage (49C) including a first output transistor (27) having a first electrode coupled to a first supply rail (VDD) and a control electrode coupled to receive the first voltage signal (25), a first output cascode transistor (29) having a first electrode coupled to a second electrode of the first output transistor (27) and a second electrode coupled to an output conductor (31) conducting the output signal (Vout), a first gate control amplifier (57A) including a first input stage including a first input transistor (51) having a control electrode (50) coupled to the first electrode of the first output cascode transistor (29) and a first active load transistor (54). The first input transistor (51) and the first active load transistor (54) are coupled to a first output (53) coupled to a control electrode of the first output cascode transistor (29). The first gate control amplifier (57A) also includes a first ancillary stage having an input coupled to the first electrode of the first output cascode transistor (29) and an output (55) coupled to a control electrode of the first active load transistor (54).

In one embodiment, the input stage (21) produces a differential voltage signal in response to an input signal, the differential voltage signal being the difference between the first voltage signal (25) and a second voltage signal (26), and the output stage (49C) includes a second output transistor (28) having a first electrode coupled to a second supply rail (GND) and a control electrode coupled to receive the second voltage signal (26). The output stage (49C) includes a second output cascode transistor (30) having a first electrode coupled to a second electrode of the second output transistor (28) and a second electrode coupled to the output conductor (31), and also includes a second gate control amplifier (67A) including a second input stage including a second input transistor (61) having a control electrode (60) coupled to the first electrode of the second output cascode transistor (30) and a second active load transistor (64), wherein the second input transistor (61) and the second active load transistor (54) are coupled to a second output (63) coupled to a control electrode of the second output cascode transistor (30), the second gate control amplifier (67A) also including a second ancillary stage having an input coupled to the first electrode of the second output cascode transistor (30) and an output (65) coupled to a control electrode of the second active load transistor (64). In the described embodiments, the transistors are MOSFETs wherein the first electrodes are sources, the second electrodes are drains, and the control electrodes are gates, wherein the first output transistor (27) is a P-channel transistor and the second output transistor (28) is a N-channel transistor. The first output cascode transistor (29) is a P-channel transistor and the second output cascode transistor (30) is a N-channel transistor. The first output cascode transistor (29) is a P-channel transistor and the second output cascode transistor (30) is a N-channel transistor. The first (29) and second (30) output cascode transistors are high voltage rated transistors and the first (27) and second (28) output transistors are low voltage rated transistors.

In the described embodiment, the input stage (21) includes N-channel first (2) and second (3) input transistors having gate electrodes coupled to receive first (Vin−) and second (Vin+) input signals, respectively, the amplifier input signal being equal to the difference between the second (Vin+) and first (Vin−) input signals, sources of the first (2) and second (3) input transistors being coupled to a first tail current source (7), drains of the first (2) and second (3) input transistors being coupled to first (8) and second (9) inputs of a folded cascode stage (45), and wherein the input stage (21) also includes P-channel third (4) and fourth (5) input transistors having gate electrodes coupled to receive the first (Vin−) and second (Vin+) input signals, respectively, sources of the third (4) and fourth (5) input transistors being coupled to a second tail current source (6), drains of the third (4) and fourth (5) input transistors being coupled to third (11) and fourth (10) inputs of the folded cascode stage (45).

The folded cascode stage (45) includes P-channel first (16) and second (17) current mirror transistors having drains coupled to the first (8) and second (9) folded cascode stage inputs, respectively, each of the first (16) and second (17) current mirror transistors having a source coupled to the first supply rail (VDD), wherein the folded cascode stage (45) also includes P-channel first (12) and second (13) folded cascode transistors having sources coupled to the drains of the first (16) and second (17) current mirror transistors, respectively, a drain of the first folded cascode transistor (12) being coupled to gates of the first (16) and second (17)

current mirror transistors, a drain of the second folded cascode transistor (13) being coupled to a first differential voltage signal conductor (25) conducting the first voltage signal, gates of the first (12) and second (13) folded cascode transistors being coupled to a first voltage source (18A). The folded cascode stage (45) also includes N-channel third (19) and fourth (20) current mirror transistors having drains coupled to the third (11) and fourth (10) folded cascode stage inputs, respectively, each of the third (19) and fourth (20) current mirror transistors having a source coupled to the second supply rail (GND), wherein the folded cascode stage (45) also includes N-channel third (14) and fourth (15) folded cascode transistors having sources coupled to the drains of the third (19) and fourth (20) current mirror transistors, respectively, a drain of the third folded cascode transistor (14) being coupled to the gates of the first (16) and second (17) current mirror transistors, a drain of the fourth folded cascode transistor (15) being coupled to a second differential voltage signal conductor (26) conducting the second voltage signal.

A class AB bias stage (46) includes a N-channel bias transistor (35) having a source coupled to the second differential voltage signal conductor (26) and a drain coupled to the first differential voltage signal conductor (25) and a P-channel bias transistor (34) having a source coupled to the first differential voltage signal conductor (25) and a drain coupled to the second differential voltage signal conductor (26), gates of the first (35) and second (34) bias transistors being coupled to corresponding bias circuits.

In the described embodiment, the gain of a feedback loop from the control electrode (50) of the first input transistor (51) of the first gate control amplifier (57A) to the control electrode (53) of the first output cascode transistor (29) is sufficiently high to produce a predetermined low impedance at the control electrode (50) of the first input transistor (51) of the first gate control amplifier (57A) and a high impedance at the output (53) of the first gate control amplifier (57A). The predetermined low impedance is low compared to the gate impedance of the first output cascode transistor (29).

In the described embodiment, the invention reduces power dissipation during peak output currents by operating an amplifier output stage (49C) to reduce power dissipation during peak output currents by providing a first output transistor (27) having a first electrode coupled to a first supply rail and a control electrode coupled to receive a first voltage signal (25) and a first output cascode transistor (29) having a first electrode coupled to a second electrode of the first output transistor (27) and a second electrode coupled to an output conductor (31) conducting an output signal (Vout). A voltage on a control electrode of the first output cascode transistor (29) is controlled in response to a first control signal (50) on a first electrode of the first output cascode transistor (29) by applying the first control signal (50) to a control electrode of a first input transistor (51) of an input stage of a first control amplifier (57A), the input stage of the first control amplifier (57A) including an active load transistor (54), a second electrode of the first input transistor (51) of the input stage of the first control amplifier (57A) being coupled to a first electrode of the active load transistor (54) of the input stage of the first control amplifier (57A). A voltage on a control electrode of the active load transistor (54) of the input stage of the first control amplifier (57A) is controlled in response to a signal on the first electrode of the output cascode transistors (29) in accordance with a current produced in the first output transistor (27) in response to the first voltage signal (25).

DETAILED DESCRIPTION OF THE PREFERRED EMBODIMENTS

Figure 3:
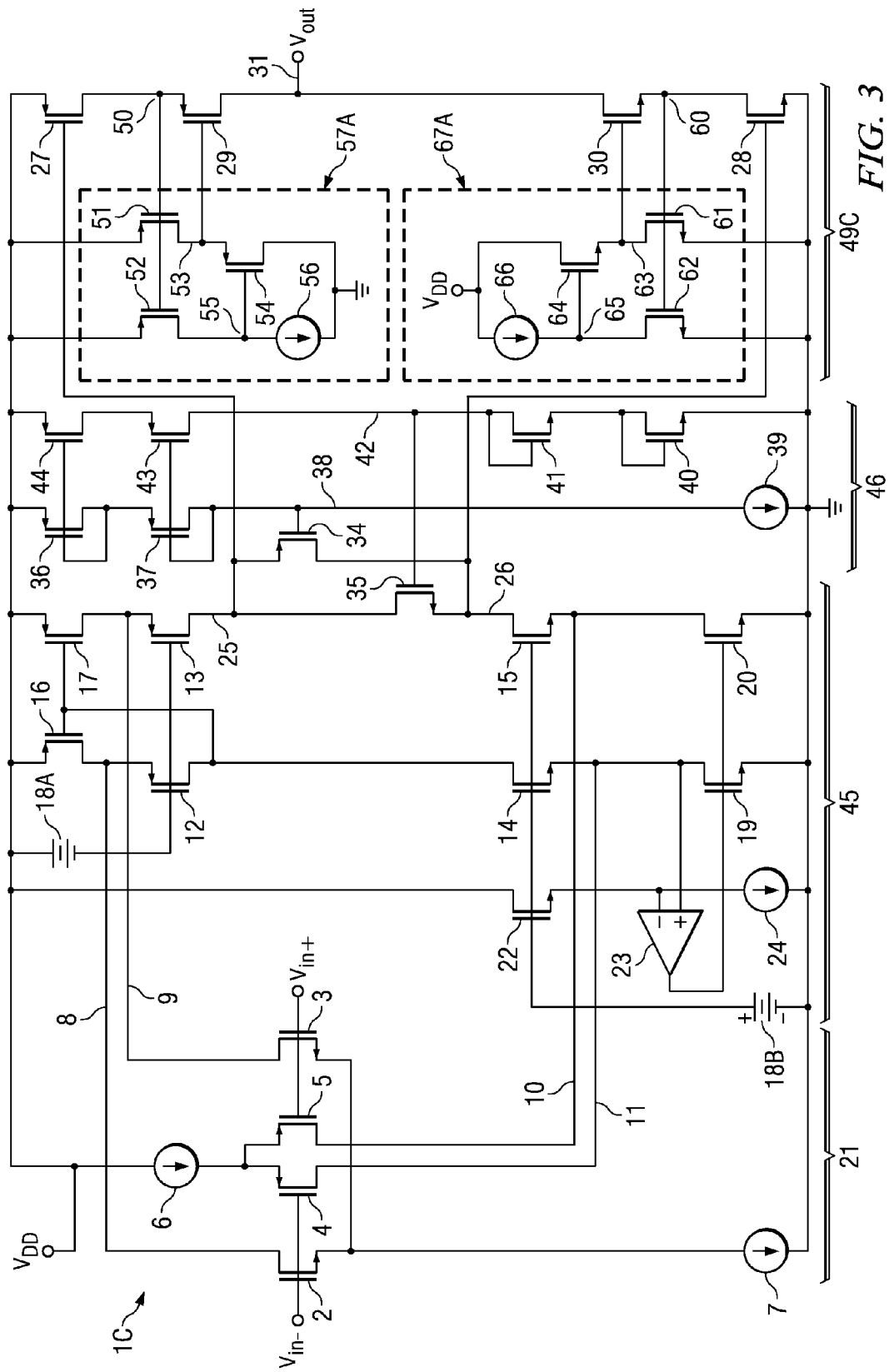
FIG. 3 is a schematic diagram of a preferred operational amplifier embodiment of the present invention.

Referring to FIG. 3, integrated operational amplifier 1C includes a conventional input stage 21, a conventional folded cascode stage 45, a conventional class AB bias stage 46, and an output stage 49C. Input stage 21 includes a first differentially coupled pair of N-channel input transistors 2 and 3 having their sources coupled to a tail current source 7. Input stage 21 also includes a second differentially coupled pair of P-channel input transistors 4 and 5 having their sources coupled to a tail current source 6. The gates of transistors 2 and 4 are coupled to receive the input signal Vin− and the gates of transistors 3 and 5 are coupled to receive the input signal Vin+. The drains of N-channel input transistors 2 and 3 are connected by folded cascode input conductors 8 and 9, respectively, to corresponding inputs of folded cascode stage 45. The drains of P-channel input transistors 4 and 5 are connected by folded cascode input conductors 11 and 10, respectively, to other corresponding inputs of folded cascode stage 45.

Folded cascode stage 45 includes P-channel current mirror transistors 16 and 17 and P-channel folded cascode transistors 12 and 13. The sources of current mirror transistors 16 and 17 are connected to VDD and their drains are connected by folded cascode input conductors 8 and 9 to the sources of cascode transistors 12 and 13, respectively. The gates of current mirror transistors 16 and 17 are connected to the drain of folded cascode transistor 12. The gates of cascode transistors 12 and 13 are connected to a reference voltage produced by voltage source 18A. The drain of cascode transistor 13 is connected by a conductor 25 to the gate of a P-channel output transistor 27 in output stage 49C.

Folded cascode stage 45 also includes N-channel current mirror transistors 19 and 20 and N-channel folded cascode transistors 14 and 15. The sources of current mirror transistors 19 and 20 are connected to ground and their drains are connected by folded cascode input conductors 11 and 10 to the sources of cascode transistors 14 and 15, respectively. The gates of current mirror transistors 19 and 20 are connected to a bias voltage produced by a bias circuit including a bias amplifier 23, a N-channel cascode transistor 22, and a current source 24. The gates of cascode transistors 14, 15 and 22 are connected to a reference voltage produced by voltage source 18B. The drain of cascode transistor 15 is connected by conductor 26 to the gate of a N-channel output transistor 28. Above mentioned cascode transistor 22 has its drain connected to VDD, its source connected to the (−) input of bias amplifier 23 and to one terminal of current source 24, the other terminal of which is connected to ground. The (+) input of amplifier 23 is connected to conductor 11. Bias amplifier 23 can be implemented as shown in FIG. 4 of above-mentioned U.S. Pat. No. 6,150,883, which is incorporated herein by reference, to provide rail-to-rail operation at very low supply voltages.

Class AB bias stage 46 includes a P-channel bias transistor 34 having its source connected to conductor 25 and its drain connected to conductor 26. Class AB bias stage 46 also includes a N-channel bias transistor 35 having its drain connected to conductor 25 and its source connected to conductor 26. The gate of bias transistor 34 is connected by conductor 38 to one terminal of a current source 39, the other terminal of which is connected to ground. Conductor 38 is also connected to the gate and drain of a diode-connected P-channel transistor 37, the source of which is connected to the gate and drain of another diode-connected P-channel transistor 36, the source of which is connected to VDD. The gate of bias transistor 35 is connected by conductor 42 to the drain of a P-channel transistor 43, the gate of which is connected to the gate and a drain of diode-connected transistor 37. The source of transistor 43 is connected to the drain of another P-channel transistor 44. The gate of transistor 44 is connected to the gate and drain of diode-connected transistor 36. The source of transistor 44 is connected to VDD. Conductor 42 is also connected to the drain and gate of a diode-connected N-channel transistor 41, the source of which is connected to the gate and drain of another N-channel diode-connected transistor 40, the source of which is connected to ground.

Output stage 49C includes above-mentioned P-channel output transistor 27 and N-channel output transistor 28. The source of output transistor 27 is connected to VDD and the source of output transistor 28 is connected to ground. The drain of P-channel output transistor 27 is connected by conductor 50 to the source of a P-channel output cascode transistor 29, the drain of which is connected by conductor 31 to produce the output voltage Vout. Similarly, the drain of output transistor 28 is connected by conductor 60 to the source of N-channel output cascode transistor 30, the drain of which is connected to Vout conductor 31.

In accordance with present invention, "upper" gate control amplifier 57A includes P-channel input transistors 51 and 52 and P-channel active load transistor 54, and also includes a current source 56. The sources of input transistors 51 and 52 are connected to VDD and the gates of input transistors 51 and 52 are connected to conductor 50, which is the input of gate control amplifier 57A. The drain of input transistor 51 is connected to conductor 53, which is the output of gate control amplifier 57A. Conductor 53 is connected to the source of active load transistor 54 and to the gate of output cascode transistor 29. The drain of active load transistor 54 is connected to ground, and its gate is connected by conductor 55 to the drain of input transistor 52 and one terminal of current source 56, the other terminal of which is connected to ground.

Figure 2:
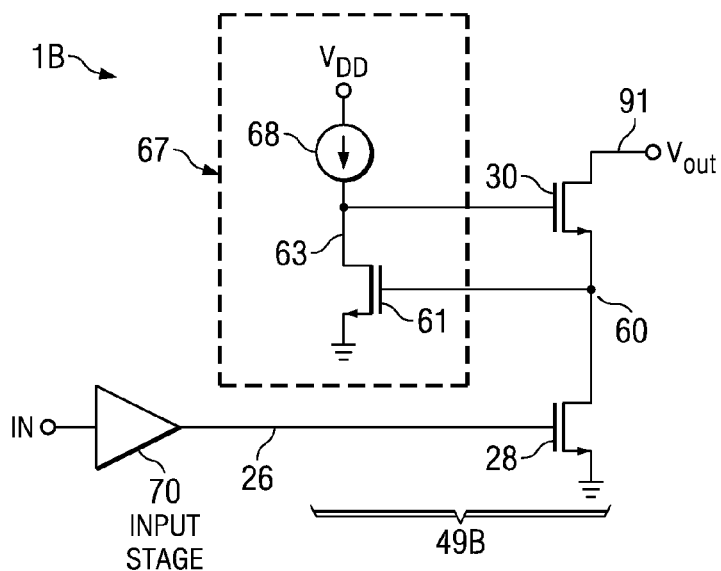
FIG. 2 is a schematic diagram of another prior art circuit.

Thus, input transistor 51 and active load transistor 54 form an output stage of gate control amplifier 57A, and input transistor 52 and current source 56 form an ancillary amplifier that controls active load transistor 54 to control the amount of current in gate control amplifier 57A in accordance with the amount of current in output transistor 27 and hence in accordance with the voltage on conductor 50. As subsequently explained, this results in substantially reduced power consumption compared to the above described circuit of prior art FIG. 2.

"Lower" gate control amplifier 67A includes N-channel input transistors 61 and 62 and N-channel active load transistor 64, and also includes a current source 66. The sources of input transistors 61 and 62 are connected to ground, and the gates of input transistors 61 and 62 are connected to conductor 60, which is the input of gate control amplifier 67A. The drain of input transistor 61 is connected to conductor 63, which is the output of gate control amplifier 67A. Conductor 63 is connected to the source of active load transistor 64 and to the gate of output cascode transistor 30. The drain of active load transistor 64 is connected to VDD, and its gate is connected by conductor 65 to the drain of input transistor 62 and one terminal of current source 66, the other terminal of which is connected to VDD. Input transistor 61 and active load transistor 64 form an output stage of gate control amplifier 67A, and input transistor 62 and current source 66 form an ancillary amplifier that controls active load transistor 64 to control the amount of current in gate control amplifier 67A in accordance with the amount of current in output transistor 28 and hence in accordance with the voltage on conductor 60.

Output cascode transistors 29 and 30 preferably are high-voltage transistors designed to withstand large source-drain voltages and large gate-source voltages. Input transistors 2, 3, 4 and 5, cascode transistors 14 and 22, class AB bias stage transistors 34 and 35, and gate control amplifier transistors 54 and 64 preferably also are high voltage transistors. The remaining transistors in FIG. 3 can be ordinary low-voltage transistors.

Referring for convenience only to lower gate control amplifier 67A, it provides a low impedance at conductor 60, i.e., at the drain of output transistor 28. To accomplish that, gate control amplifier 67A provides a feedback loop which consists of output cascode transistor 30 and gate control amplifier input transistor 61. The impedance at conductor 60 is defined by the gain in this feedback loop. A large value of the gain of this feedback loop results in the low impedance at conductor 60. Gate control amplifier 67A is a fast amplifier since it includes only a single stage signal path between its input conductor 60 and its output conductor 63, and therefore provides the low value of high-frequency impedance at conductor 60 and the high impedance at conductor 63.

During signal transients for output cascode transistor 30 or 29, there will be a large current through conductor 63 to the gate of output cascode transistor 30. To provide a large output current carrying capability when Vout increases to a high voltage, it is necessary to have a large current through active load transistor 64 into the gate of cascode output transistor 30. The operation of the ancillary stage including input transistor 62 and current source 66 provides that large current through active load transistor 64 in response to the voltage on conductor 60 only when it is needed, and thereby avoids the high overall power dissipation that occurs in the output stage of operational amplifier 1B shown in prior art FIG. 2 in which the single current source 63 is used as a load device of gate control amplifier 67.

The two stages of gate control amplifier 67A connected as shown in FIG. 3 result in high gain between input conductor 60 and output conductor 63 thereof. Transistor 61 provides the needed current-sinking capability from conductor 63 and the gate of output cascode transistor 30, and active load transistor 64 provides current sourcing capability to conductor 63 and into the gate of output cascode transistor 30 only when needed. Low-value current source 66 in gate control amplifier 67A provides biasing for input transistor 62 and defines a DC operating point for gate control amplifier circuit 67A. This overcomes the shortcoming of the circuit of prior art FIG. 2 wherein it can not provide enough current sourcing capability to conductor 63 without causing unacceptably high power consumption because its current sourcing capability is limited by the magnitude of the current source 68.

The operation of upper gate control amplifier 57A is entirely analogous to the operation of lower gate control amplifier 67A and therefore is be repeated.

Figure 1:
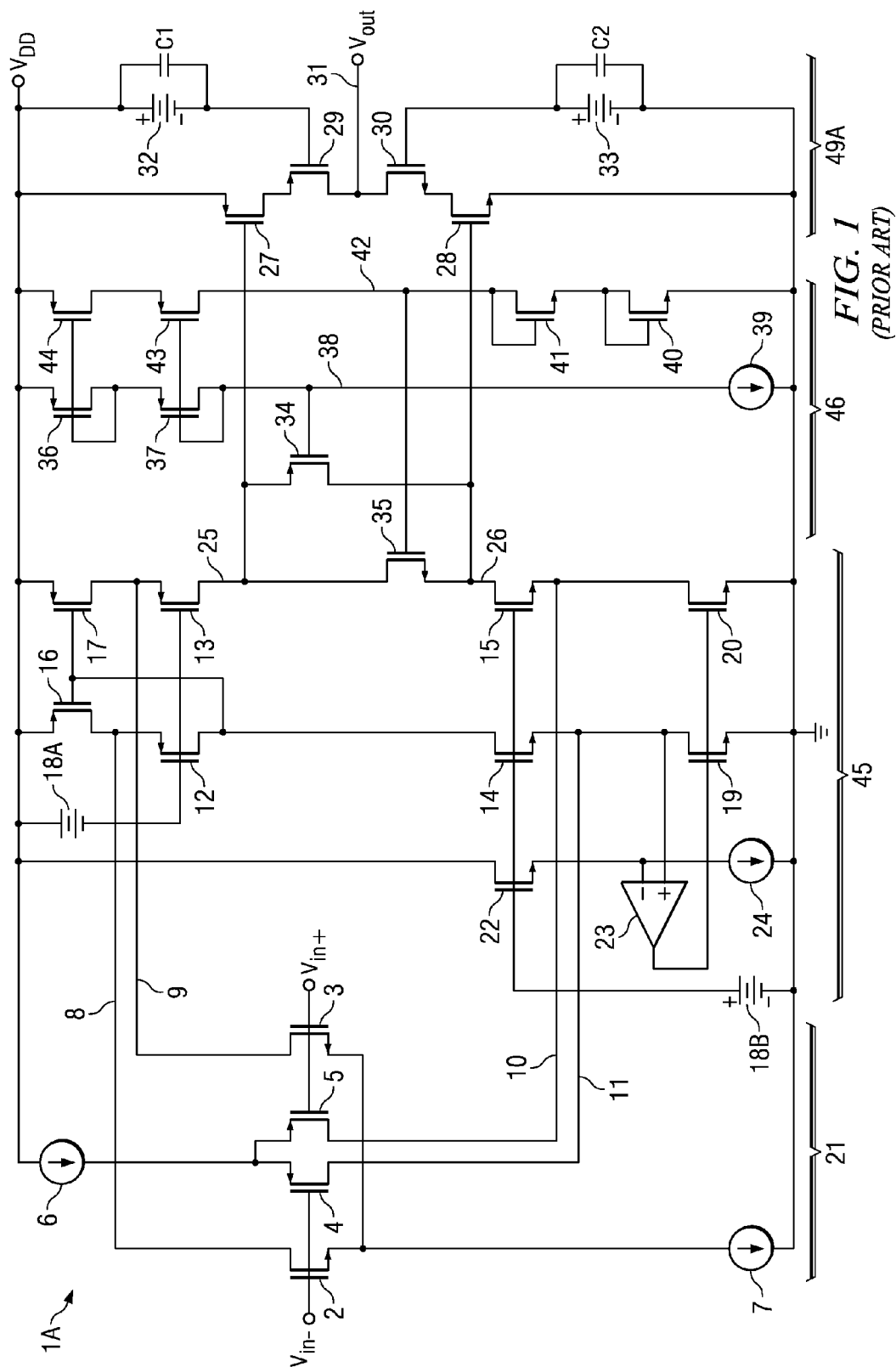
FIG. 1 is a schematic diagram of a prior art circuit.

The above described circuitry of gate control amplifiers 57A and 67A dynamically controls the gates of output cascode transistors 29 and 30 in accordance with the output currents in output transistors 27 and 28 and therefore avoids the need to provide the reference voltages 32 and 33 and associated large external capacitors C1 and C2 of prior art FIG. 1, and also reduces the component count of the operational amplifier. The use of gate control amplifiers 57A and 67A also substantially increases the bandwidth of operational amplifier 1C.

The use of gate control amplifiers 57A and 67A increases the operational amplifier bandwidth, because without them the high impedance at conductor 60 is a high impedance at the drain of output transistor 28 and the high impedance at conductor 50 is a high impedance at the drain of output transistor 27. This creates an additional pole in the operational amplifier output signal path due to the gate-drain capacitances of output transistors 27 and 28 and thereby slows down the operational amplifier 1C, reducing its bandwidth.

It should be appreciated that the use of gate control amplifiers 57A and 67A reduces signal distortion in Vout by avoiding high impedance at the drains of output transistors 27 and 28, thereby avoiding associated parasitic feedback through gate-source impedances of output transistors 27 and 28, and thereby avoids degradation of the overall loop gain and thereby reduces signal distortion.

It should be appreciated that the output current sourcing circuitry and/or the output current sinking circuitry shown in output stage 49C of FIG. 3 also can be used in various kinds of circuitry other than operational amplifiers. Although operational amplifiers have push-pull output stages, there are various other kinds of circuits which only need to source a large output current or which only need to sink a large output current. The current sourcing circuitry comprised of upper gate control circuit 57A and transistors 27 and 29 and/or current sinking circuitry comprised of lower gate control circuit 67A and transistors 20 and 30 can be very useful in such other kinds of circuits.

Figure 4A:
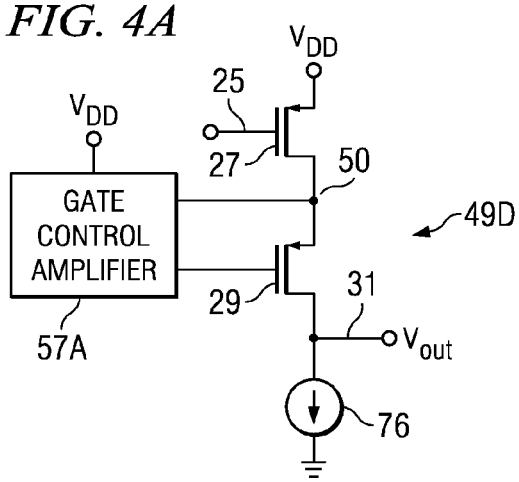
FIG. 4A is a schematic diagram of another configuration of output stage 49C of FIG. 3.
Figure 4B:
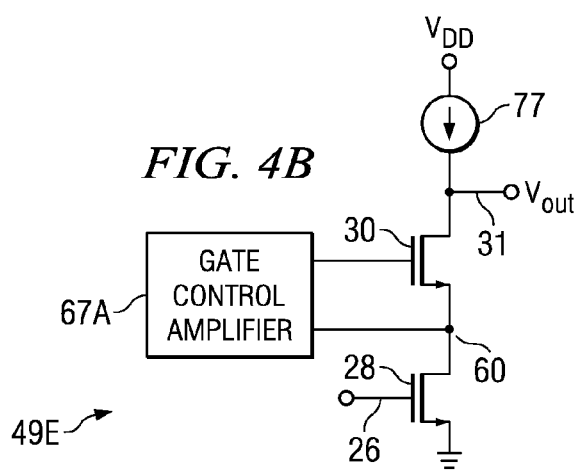
FIG. 4B is a schematic diagram of yet another configuration of output stage 49C of FIG. 3.

FIG. 4A illustrates an output stage 49D wherein upper gate control circuit 57A and P-channel transistors 27 and 29 are used, but lower gate control circuit 67A and transistors 28 and 30 of FIG. 3 are replaced by a current source 76. Similarly, FIG. 4B illustrates an output stage 49E wherein the lower gate control circuit 67A and N-channel transistors 28 and 30 of FIG. 3 are used, but upper gate control circuit 57A and transistors 27 and 29 are replaced by a current source 77. If only one of upper gate control circuit 57A and 67A is used, then the input stage does not need to be a differential stage. Also, if Vout does not need to go above certain voltage, or if the output load current through Vout conductor 31 is always in the same direction, it may be necessary to only use the "upper" P-channel cascode transistors 12 and 13 or to use only the "lower" N-channel cascode transistors 14 and 15.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, operational amplifier 1C of FIG. 3 can be configured to include only one of the differential input transistor pairs 2,3 or 4,5 and its associated folded cascode circuitry. Also, operational amplifier 1C can be configured to include only one of gate control amplifiers 57A or 67A if only a large load current needs to be sourced or if only a large load current needs to be sinked. Furthermore, output stage circuits including only a gate control amplifier 57A or a gate control amplifier 67A can be used in conjunction with input stage circuitry other than the input stage 21, folded cascode stage 45 and/or class AB bias circuit 46 shown in FIG. 3.

Also, it should be appreciated that although a CMOS implementation is described, the invention is applicable to a bipolar transistor implementation.

What is claimed is:

1. An amplifier comprising:
    (a) an input stage for producing a first voltage signal;
    (b) an output stage for producing an output signal in response to the first voltage signal, the output stage including
        i. a first output transistor having a first electrode coupled to a first supply rail and a control electrode coupled to receive the first voltage signal,
        ii. a first output cascode transistor having a first electrode coupled to a second electrode of the first output transistor and a second electrode coupled to an output conductor conducting the output signal, and
        iii. a first gate control amplifier including a first input stage including a first input transistor having a control electrode coupled to the first electrode of the first output cascode transistor and a first active load transistor, the first input transistor and the first active load transistor being coupled to a first output coupled to a control electrode of the first output cascode transistor, the first gate control amplifier also including a first ancillary stage having an input coupled to the first electrode of the first output cascode transistor and an output coupled to a control electrode of the first active load transistor.

2. The amplifier of claim 1 wherein the input stage produces a differential voltage signal in response to an amplifier input signal, the differential voltage signal being the difference between the first voltage signal and a second voltage signal, and wherein the output stage includes a second output transistor having a first electrode coupled to a second supply rail and a control electrode coupled to receive the second voltage signal, and wherein the output stage includes a second output cascode transistor having a first electrode coupled to a second electrode of the second output transistor and a second electrode coupled to the output conductor, and wherein the output stage includes a second gate control amplifier including a second input stage including a second input transistor having a control electrode coupled to the first electrode of the second output cascode transistor and a second active load transistor, the second input transistor and the second active load transistor being coupled to a second output coupled to a control electrode of the second output cascode transistor, the second gate control amplifier also including a second ancillary stage having an input coupled to the first electrode of the second output cascode transistor and an output coupled to a control electrode of the second active load transistor.

3. The amplifier of claim 2 wherein the transistors are MOSFETs and wherein the first electrodes are sources, the second electrodes are drains, and the control electrodes are gates.

4. The amplifier of claim 3 wherein the first output transistor is a P-channel transistor and the second output transistor is a N-channel transistor.

5. The amplifier of claim 3 wherein the first output cascode transistor is a P-channel transistor and the second output cascode transistor is a N-channel transistor.

6. The amplifier of claim 4 wherein the first output cascode transistor is a P-channel transistor and the second output cascode transistor is a N-channel transistor.

7. The amplifier of claim 6 wherein the first and second output cascode transistors are high voltage rated transistors and the first and second output transistors are low voltage rated transistors.

8. The amplifier of claim 6 wherein the input stage includes N-channel first and second input transistors having gate electrodes coupled to receive first and second input signals, respectively, the amplifier input signal being equal to the difference between the second and first input signals, sources of the first and second input transistors being coupled to a first tail current source, drains of the first and second input transistors being coupled to first and second inputs of a folded cascode stage, and wherein the input stage also includes P-channel third and fourth input transistors having gate electrodes coupled to receive the first and second input signals, respectively, sources of the third and fourth input transistors being coupled to a second tail current source, drains of the third and fourth input transistors being coupled to third and fourth inputs of the folded cascode stage.

9. The amplifier of claim 8 wherein
the folded cascode stage includes P-channel first and second current mirror transistors having drains coupled to the first and second inputs of the folded cascode stage, respectively, each of the first and second current mirror transistors having a source coupled to the first supply rail, wherein the folded cascode stage also includes P-channel first and second folded cascode transistors having sources coupled to the drains of the first and second current mirror transistors, respectively, a drain of the first folded cascode transistor being coupled to gates of the first and second current mirror transistors, a drain of the second folded cascode transistor being coupled to a first differential voltage signal conductor conducting the first voltage signal,
the folded cascode stage also includes N-channel third and fourth current mirror transistors having drains coupled to the third and fourth inputs of the folded cascode stage, respectively, each of the third and fourth current mirror transistors having a source coupled to the second supply rail, wherein the folded cascode stage also includes N-channel third and fourth folded cascode transistors having sources coupled to the drains of the third and fourth current mirror transistors, respectively, a drain of the third folded cascode transistor being coupled to the gates of the first and second current mirror transistors, a drain of the fourth folded cascode transistor being coupled to a second differential voltage signal conductor conducting the second voltage signal, and
gates of the first and second folded cascode transistors being coupled to a first reference voltage source, gates of the third and fourth folded cascode transistors being coupled to a second reference voltage source, gates of the third and fourth current mirror transistors being coupled to a folded cascode bias circuit.

10. The amplifier of claim 9 including a class AB bias stage which includes a—channel bias transistor having a source coupled to the second differential voltage signal conductor and a drain coupled to the first differential voltage signal conductor, and a P-channel bias transistor having a source coupled to the first differential voltage signal conductor and a drain coupled to the second differential voltage signal conductor, gates of the first and second bias transistors being coupled to first and second class AB bias circuits, respectively.

11. The amplifier of claim 8 wherein the folded cascode bias circuit includes an N-channel fifth cascode transistor having a drain coupled to the first supply rail, a gate coupled to the second reference voltage source, and a source coupled to one terminal of a current source having another terminal coupled to the second supply rail, and a bias amplifier having an inverting input coupled to the source of the fifth cascode transistor and a non-inverting input coupled to the drain of the third current mirror transistor, an output of the bias amplifier being coupled to the gates of the third and fourth current mirror transistors.

12. The amplifier of claim 1 wherein a gain of a feedback loop from the control electrode of the first input transistor of the first gate control amplifier to the control electrode of the first output cascode transistor is sufficiently high to produce a predetermined low output impedance at the control electrode of the first input transistor of the first gate control amplifier.

13. The amplifier of claim 11 wherein the predetermined lo impedance is low compared to the gate impedance of the first output cascode transistor.

14. The amplifier of claim 1 including a current source coupled between the output conductor and a second supply rail.

15. A method of operating an amplifier output stage to reduce power dissipation during peak output currents, the method comprising:
(a) providing a first output transistor having a first electrode coupled to a first supply rail and a control electrode coupled to receive a first voltage signal and a first output cascode transistor having a first electrode coupled to a second electrode of the first output transistor and a second electrode coupled to an output conductor conducting an output signal;
(b) controlling a voltage on a control electrode of the first output cascode transistor in response to a first control signal on a first electrode of the first output cascode transistor by applying the first control signal to a control electrode of a first input transistor of an input stage of a first control amplifier, the input stage of the first control amplifier including an active load transistor, a second electrode of the first input transistor of the input stage of the first control amplifier being coupled to a first electrode of the active load transistor of the input stage of the first control amplifier; and
(c) controlling a voltage on a control electrode of the active load transistor of the input stage of the first control amplifier in response to the first control signal in accordance with a current produced in the first output transistor in response to the first voltage signal.

16. The method of claim 15 wherein the first supply rail conducts a supply voltage that is greater than the output signal.

17. The method of claim 15 wherein the first supply rail conducts a supply voltage that is less than the output signal.

18. The method of claim 15 including providing a second output transistor having a first electrode coupled to a second supply rail and a second output cascode transistor having a first electrode coupled to a second electrode of the second output transistor, a second electrode coupled to the output conductor, and a control electrode coupled to receive a second voltage signal;

controlling a voltage on a control electrode of the second output cascode transistor in response to a second control signal on a first electrode of the second cascode transistor by applying the second control signal to a control electrode of a first input transistor of an input stage of a second control amplifier, the input stage of the second control amplifier including an active load transistor, a second electrode of the first input transistor of the input stage of the second control amplifier being coupled to a first electrode of the active load transistor of the input stage of the second control amplifier; and controlling a voltage on a control electrode of the active load transistor of the input stage of the second control amplifier in response to the second control signal.

19. The method of claim 15 wherein the transistors are MOSFETs and wherein the first electrodes are sources, the second electrodes are drains, and the control electrodes are gates, wherein the first output transistor is a P-channel transistor and the second output transistor is a N-channel transistor, wherein step (b) includes providing an impedance at the source of the first output cascode transistor which is substantially lower than a gate impedance of the first output cascode transistor to increase the bandwidth of the amplifier output stage.

20. An amplifier output stage having reduced power dissipation during peak output currents, comprising:

(a) a first output transistor having a first electrode coupled to a first supply rail and a control electrode coupled to receive a first voltage signal and a first output cascode transistor having a first electrode coupled to a second electrode of the first output transistor and a second electrode coupled to an output conductor conducting an output signal; and (b) circuitry for controlling a voltage on a control electrode of the first output cascode transistor in response to a control signal on a first electrode of the first output cascode transistor, the control circuitry including i. means for applying the control signal to a control electrode of an input transistor of an input stage of a control amplifier, and ii. means for controlling an active load transistor in response to the control signal, a second electrode of the first input transistor being coupled to a first electrode of the active load transistor to boost the magnitude of the voltage on the control electrode of the first output cascode transistor in response to a large current flowing through the first output cascode transistor.

* * * * *